United States Patent
Zhang et al.

(10) Patent No.: US 10,468,474 B2
(45) Date of Patent: Nov. 5, 2019

(54) TOP-EMISSION TYPE ORGANIC LIGHT EMITTING DIODE DISPLAY SUBSTRATE

(71) Applicant: BOE TECHNOLOGY GROUP CO., LTD., Beijing (CN)

(72) Inventors: Can Zhang, Beijing (CN); Xiaochuan Chen, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 18 days.

(21) Appl. No.: 15/741,738

(22) PCT Filed: Aug. 8, 2017

(86) PCT No.: PCT/CN2017/096405
§ 371 (c)(1),
(2) Date: Jan. 3, 2018

(87) PCT Pub. No.: WO2015/099124
PCT Pub. Date: Jun. 7, 2018

(65) Prior Publication Data
US 2019/0081120 A1    Mar. 14, 2019

(30) Foreign Application Priority Data
Nov. 29, 2016    (CN) .......................... 2016 1 1090179

(51) Int. Cl.
*H01L 29/08*    (2006.01)
*H01L 33/08*    (2010.01)
(Continued)

(52) U.S. Cl.
CPC ...... *H01L 27/3262* (2013.01); *H01L 51/0008* (2013.01); *H01L 51/102* (2013.01);
(Continued)

(58) Field of Classification Search
CPC ......... H01L 2251/5315; H01L 27/3248; H01L 27/3258; H01L 27/3262; H01L 51/0008;
(Continued)

(56) References Cited

U.S. PATENT DOCUMENTS 7,282,736 B2    10/2007    Murakami et al.
7,531,958 B2    5/2009    Nishikawa et al.
(Continued)

FOREIGN PATENT DOCUMENTS

CN    101188246 A    5/2008
CN    206194792 U    5/2017
(Continued)

OTHER PUBLICATIONS

International Search Report & Written Opinion dated Oct. 27, 2017, regarding PCT/CN2017/096405.
(Continued)

*Primary Examiner* — Alonzo Chambliss
(74) *Attorney, Agent, or Firm* — Intellectual Valley Law, P.C.

(57) ABSTRACT

The present application discloses a top-emission type organic light emitting diode display substrate having a plurality of subpixel areas, in each of which the top-emission type organic light emitting diode display substrate includes a base substrate; a thin film transistor on the base substrate and including a drain electrode; and an organic light emitting diode on a side of the drain electrode distal to the base substrate. The organic light emitting diode includes a first electrode on a side of the drain electrode distal to the base substrate; an organic layer on a side of the first electrode distal to the drain electrode; and a second electrode on a side of the organic layer distal to the first electrode. The first electrode is a substantially transparent electrode and electrically connected to the drain electrode. The drain electrode
(Continued)

is a reflective electrode. The second electrode is a substantially transparent electrode.

20 Claims, 4 Drawing Sheets

(51) Int. Cl.
  *H01L 31/0232*  (2014.01)
  *H01L 21/00*  (2006.01)
  *H01L 51/40*  (2006.01)
  *H01L 27/32*  (2006.01)
  *H01L 51/10*  (2006.01)
  *H01L 51/52*  (2006.01)
  *H01L 51/00*  (2006.01)
  *H01L 51/50*  (2006.01)

(52) U.S. Cl.
  CPC ........ *H01L 51/508* (2013.01); *H01L 51/5036* (2013.01); *H01L 51/5056* (2013.01); *H01L 51/5088* (2013.01); *H01L 51/5206* (2013.01); *H01L 51/5234* (2013.01); *H01L 2227/323* (2013.01); *H01L 2251/5315* (2013.01)

(58) Field of Classification Search
  CPC ............... H01L 51/102; H01L 51/5036; H01L 51/5056; H01L 51/508; H01L 51/5088; H01L 51/5206; H01L 51/5234; H01L 51/5265

See application file for complete search history.

(56) References Cited

U.S. PATENT DOCUMENTS

| | | | |
|---|---|---|---|
| 2013/0092919 A1* | 4/2013 | Kurihara | ................. H01L 51/56 257/40 |
| 2014/0159078 A1 | 6/2014 | Kim | |
| 2017/0032167 A1* | 2/2017 | Chen | ................... H01L 27/3227 |

FOREIGN PATENT DOCUMENTS

| | | |
|---|---|---|
| KR | 20100036908 A | 4/2010 |
| KR | 20160039105 A | 4/2016 |

OTHER PUBLICATIONS

First Office Action in the Korean Patent Application No. 20187002013, dated Apr. 14, 2019; English translation attached.

\* cited by examiner

TOP-EMISSION TYPE ORGANIC LIGHT EMITTING DIODE DISPLAY SUBSTRATE

CROSS-REFERENCE TO RELATED APPLICATION

This application is a national stage application under 35 U.S.C. § 371 of International Application No. PCT/CN2017/096405, filed Aug. 8, 2017, which claims priority to Chinese Patent Application No. 201611090179.X, filed Nov. 29, 2016, the contents of which are incorporated by reference in the entirety.

TECHNICAL FIELD

The present invention relates to display technology, more particularly, to a top-emission type organic light emitting diode display substrate, a top-emission type organic light emitting diode display apparatus, and a method of forming a top-emission type organic light emitting diode display substrate.

BACKGROUND

Organic light emitting diode (OLED) display apparatuses are self-emissive devices, and do not require backlights. OLED display apparatuses also provide more vivid colors and a larger color gamut as compared to the conventional liquid crystal display (LCD) apparatuses. Further, OLED display apparatuses can be made more flexible, thinner, and lighter than a typical LCD.

An OLED display apparatus typically includes an anode, an organic layer including an organic light emitting layer, and a cathode. OLEDs can either be a bottom-emission type OLED or a top-emission type OLED. In bottom-emission type OLEDs, the light is extracted from an anode side. In bottom-emission type OLEDs, the anode is generally transparent, while a cathode is generally reflective. In a top-emission type OLED, light is extracted from a cathode side. The cathode is optically transparent, while the anode is reflective.

SUMMARY

In one aspect, the present invention provides a top-emission type organic light emitting diode display substrate having a plurality of subpixel areas, in each of which the top-emission type organic light emitting diode display substrate comprising a base substrate; a thin film transistor on the base substrate and comprising a drain electrode, the drain electrode is a reflective electrode; and an organic light emitting diode on a side of the drain electrode distal to the base substrate; wherein the organic light emitting diode comprises a first electrode on a side of the drain electrode distal to the base substrate, the first electrode is a substantially transparent electrode and electrically connected to the drain electrode; an organic layer on a side of the first electrode distal to the drain electrode, the organic layer comprises an organic light emitting layer; and a second electrode on a side of the organic layer distal to the first electrode, the second electrode is a substantially transparent electrode.

Optionally, an orthographic projection of the drain electrode on the base substrate substantially covers that of a light emitting region of the organic light emitting layer.

Optionally, the orthographic projection of the drain electrode on the base substrate substantially overlaps with that of the light emitting region of the organic light emitting layer.

Optionally, the orthographic projection of the drain electrode on the base substrate substantially covers that of the first electrode layer.

Optionally, the orthographic projection of the drain electrode on the base substrate substantially overlaps with that of the first electrode layer.

Optionally, the drain electrode and the second electrode form a microcavity structure.

Optionally, the microcavity structure has an optical distance substantially equal to a sum of optical path lengths of layers between the drain electrode and the second electrode.

Optionally, the optical distance is a non-integer multiple of $2\pi\lambda$, $\lambda$ is a wavelength of light emitted from the organic light emitting layer.

Optionally, the top-emission type organic light emitting diode display substrate further comprises a planarization layer on a side of the drain electrode distal to the base substrate; and a passivation layer on a side of the planarization layer distal to the drain electrode.

Optionally, the optical distance is substantially equal to a sum of optical path lengths of the passivation layer, the planarization layer, the organic layer, and the first electrode.

Optionally, the drain electrode is made of a low-reflectivity metal material.

Optionally, the drain electrode is made of molybdenum or nickel.

Optionally, the second electrode is made of a metallic material.

Optionally, the second electrode is made of magnesium: silver alloy.

Optionally, the first electrode has a thickness in a range of approximately 800 Å to approximately 2000 Å.

Optionally, the planarization layer has a thickness in a range of approximately 10000 Å to approximately 30000 Å.

Optionally, the planarization layer comprises a plurality of sub-layers; and refractive indexes of the plurality of sub-layers of the planarization layer decrease along a thickness direction away from the base substrate.

In another aspect, the present invention provides a top-emission type organic light emitting diode display apparatus comprising a top-emission type organic light emitting diode display substrate described herein or fabricated by a method described herein.

In another aspect, the present invention provides a method of forming a top-emission type organic light emitting diode display substrate having a plurality of subpixel areas, the method comprising, in each of the plurality of subpixel areas, forming a thin film transistor comprising a drain electrode on the base substrate, the drain electrode is formed using a reflective conductive material; and forming an organic light emitting diode on a side of the drain electrode distal to the base substrate; wherein forming the organic light emitting diode comprises forming a first electrode on a side of the drain electrode distal to the base substrate, the first electrode is formed using a substantially transparent conductive material and formed to be electrically connected to the drain electrode; forming an organic layer on a side of the first electrode distal to the drain electrode, the organic layer comprises an organic light emitting layer; and forming a second electrode on a side of the organic layer distal to the first electrode, the second electrode is formed using a substantially transparent conductive material.

Optionally, forming the second electrode is performed by a vapor deposition process.

BRIEF DESCRIPTION OF THE FIGURES

The following drawings are merely examples for illustrative purposes according to various disclosed embodiments and are not intended to limit the scope of the present invention.

DETAILED DESCRIPTION

Figure 1:
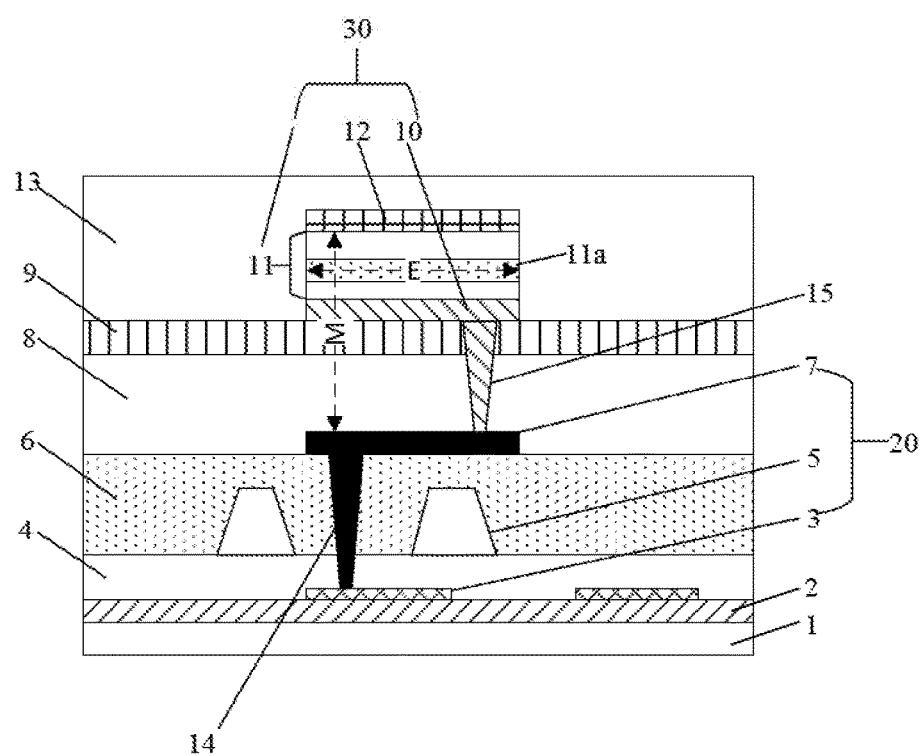
FIG. 1 is a schematic diagram illustrating the structure of a top-emission type organic light emitting diode display substrate in some embodiments according to the present disclosure.

The disclosure will now be described more specifically with reference to the following embodiments. It is to be noted that the following descriptions of some embodiments are presented herein for purpose of illustration and description only. It is not intended to be exhaustive or to be limited to the precise form disclosed.

To enhance aperture ratio of conventional organic light emitting diode display apparatus, typically a top-emission type organic light emitting diode display substrate is used. In the conventional top-emission type organic light emitting diode display substrate, relatively strong microcavity effects are observed. In the conventional display substrate, the anode and the cathode constitute two reflective mirrors of the microcavity. The optical distance of the microcavity is relatively small resulting in relatively strong microcavity effects. Due to the strong microcavity effects, light emitted from the conventional top-emission type organic light emitting diode display substrate has a narrow spectrum. Thus, the microcavity effects make it very difficult to achieve a full-spectrum light emission in the conventional top-emission type organic light emitting diode display substrate. The performance and light emission quality of the conventional organic light emitting diode display apparatus are limited.

Accordingly, the present disclosure provides, inter alia, a top-emission type organic light emitting diode display substrate, a top-emission type organic light emitting diode display apparatus, and a method of forming a top-emission type organic light emitting diode display substrate that substantially obviate one or more of the problems due to limitations and disadvantages of the related art. In one aspect, the present disclosure provides a top-emission type organic light emitting diode display substrate having a plurality of subpixel areas. In some embodiments, the top-emission type organic light emitting diode display substrate includes, in each of the plurality of subpixel areas, a base substrate; a thin film transistor on the base substrate and having a reflective drain electrode; and an organic light emitting diode on a side of the reflective drain electrode distal to the base substrate. Optionally, the organic light emitting diode includes a first electrode on a side of the drain electrode distal to the base substrate, the first electrode is a substantially transparent electrode and electrically connected to the drain electrode; an organic layer on a side of the first electrode distal to the drain electrode, the organic layer includes an organic light emitting layer, and a second electrode on a side of the organic layer distal to the first electrode, the second electrode is a substantially transparent electrode. The top-emission type organic light emitting diode display substrate is configured to emit light substantially along a direction from the first electrode to the second electrode.

As used herein, the term "subpixel area" refers to an area in an array substrate corresponding to a subpixel in a display panel having the array substrate. A subpixel area includes a subpixel region and an inter-subpixel region. As used herein, the term "substantially transparent" mean at least 50 percent (e.g., at least 60 percent, at least 70 percent, at least 80 percent, at least 90 percent, and at least 95 percent) of light in the visible wavelength range transmitted therethrough.

FIG. 1 is a schematic diagram illustrating the structure of a top-emission type organic light emitting diode display substrate in some embodiments according to the present disclosure. Referring to FIG. 1, the top-emission type organic light emitting diode display substrate in some embodiments includes a base substrate 1, a thin film transistor 20 on the base substrate 1, a passivation layer 9 on a side of the thin film transistor 20 distal to the base substrate 1, and an organic light emitting diode 30 on a side of the passivation layer 9 distal to the thin film transistor 20. The thin film transistor 20 in some embodiments includes, inter alia, a drain electrode 7, an active layer 3, and a gate electrode 5. The drain electrode 7 is electrically connected to a drain electrode contact region of the active layer 3. Optionally, the organic light emitting diode 30 is on a side of the passivation layer 9 distal to the drain electrode 7.

In some embodiments, the organic light emitting diode 30 includes a first electrode 10 on a side of the passivation layer 9 distal to the drain electrode 7, an organic layer 11 on a side of the first electrode 10 distal to the passivation layer 9, and a second electrode 12 on a side of the organic layer 11 distal to the first electrode 10. Optionally, the top-emission type organic light emitting diode display substrate is configured to emit light substantially along a direction from the first electrode 10 to the second electrode 12. The first electrode 10 is electrically connected to the drain electrode 7. Optionally, the first electrode 10 is a substantially transparent electrode. Optionally, the first electrode 10 is an anode of the organic light emitting diode 30, and the second electrode 12 is a cathode of the organic light emitting diode 30.

The organic layer 11 in some embodiments includes an organic light emitting layer 11a. The organic light emitting layer 11a has a light emitting region E, as shown in FIG. 1. In some embodiments, an orthographic projection of the drain electrode 7 on the base substrate 1 substantially covers that of a light emitting region E of the organic light emitting layer 11a. Optionally, the orthographic projection of the drain electrode 7 on the base substrate 1 substantially overlaps with that of the light emitting region E of the organic light emitting layer 11a. Optionally, the orthographic projection of the drain electrode 7 on the base substrate 1 substantially covers that of the organic light emitting layer 11a. Optionally, the orthographic projection of the drain electrode 7 on the base substrate 1 substantially overlaps with that of the organic light emitting layer 11a. Optionally, a width of the drain electrode 7 is substantially equal to or greater than that of the light emitting region E of the organic light emitting layer 11a. Optionally, a width of the drain electrode 7 is substantially equal to or greater than that of the organic light emitting layer 11a. Optionally, the orthographic projection of the drain electrode 7 on the base substrate 1 substantially covers that of the first electrode layer 10. Optionally, the orthographic projection of the drain electrode 7 on the base substrate 1 substantially overlaps with that of the first electrode layer 10. Optionally, the width of the drain electrode 7 is substantially equal to or greater than that of the first electrode layer 10. Optionally, the width of the drain electrode 7 is substantially equal to that of the first electrode layer 10. Optionally, the width of the drain electrode 7 is substantially equal to that of the second electrode layer 12.

Figure 2:
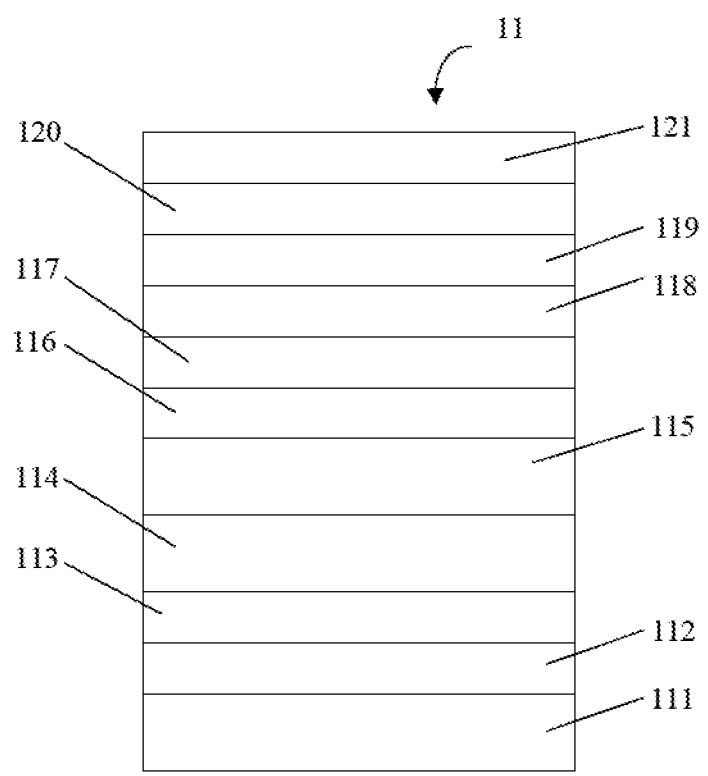
FIG. 2 is a schematic diagram illustrating the structure of an organic layer in some embodiments according to the present disclosure.

FIG. 2 is a schematic diagram illustrating the structure of an organic layer in some embodiments according to the present disclosure. Referring to FIG. 1 and FIG. 2, the organic layer 11 in some embodiments includes a first hole injection layer 111 on the first electrode 10, a second hole injection layer 112 on a side of the first hole injection layer 111 distal to the first electrode 10, a red light emitting layer 113 on a side of the second hole injection layer 112 distal to the first hole injection layer 111, a green light emitting layer 114 on a side of the red light emitting layer 113 distal to the second hole injection layer 112, a first electron transport layer 115 on a side of the green light emitting layer 114 distal to the red light emitting layer 113, a first charge generating layer 116 on a side of the first electron transport layer 115 distal to the green light emitting layer 114, a third hole injection layer 117 on a side of the first charge generating layer 116 distal to the first electron transport layer 115, a hole transport layer 118 on a side of the third hole injection layer 117 distal to the first charge generating layer 116, a blue light emitting layer 119 on a side of the hole transport layer 118 distal to the third hole injection layer 117, a second electrode transport layer 120 on a side of the blue light emitting layer 119 distal to the hole transport layer 118, and a second charge generating layer 121 on a side of the second electrode transport layer 120 distal to the blue light emitting layer 119.

Referring to FIG. 1, the top-emission type organic light emitting diode display substrate in some embodiments further includes a buffer layer 2 between the active layer 3 and the base substrate 1. Optionally, the top-emission type organic light emitting diode display substrate further includes a gate insulating layer 4 between the gate electrode 5 and the active layer 3. Optionally, the top-emission type organic light emitting diode display substrate further includes an inter-layer dielectric layer 6 between the gate electrode 5 and the drain electrode 7. Optionally, the top-emission type organic light emitting diode display substrate further includes a source electrode in a same layer as the drain electrode 7. Optionally, the top-emission type organic light emitting diode display substrate further includes a protective layer 13 on a side of the second electrode 12 distal to the base substrate 1.

In some embodiments, the top-emission type organic light emitting diode display substrate further includes a planarization layer 8 on a side of the drain electrode 7 distal to the base substrate 1. Optionally, the passivation layer 9 is on a side of the planarization layer 8 distal to the drain electrode 7. Optionally, the planarization layer 8 and the passivation layer 9 are between the drain electrode 7 and the first electrode 10.

In some embodiments, the top-emission type organic light emitting diode display substrate further includes a first via 14 extending through the inter-layer dielectric layer 6 and the gate insulating layer 4. The drain electrode 7 is electrically connected to the active layer 3 through the first via 14.

In some embodiments, the top-emission type organic light emitting diode display substrate further includes a second via 15 extending through the planarization layer 8 and the passivation layer 9. The first electrode 10 is electrically connected to the drain electrode 7 through the second via 15.

Various appropriate reflective conductive materials may be used for making the drain electrode 7. Examples of appropriate reflective conductive materials include reflective conductive materials having a relatively low reflectivity. Optionally, the drain electrode 7 is made of a low-reflectivity metal such as molybdenum and nickel. Having a drain electrode 7 made of a reflective conductive material having a relatively low reflectivity further reduces microcavity effects in the top-emission type organic light emitting diode display substrate. Optionally, the drain electrode 7 includes a plurality of sub-layers laminated together. In one example, the drain electrode 7 is include a titanium/aluminum/titanium three-layer structure. As used herein, the term "low-reflectivity" refers to a layer or a material that reflects no more than approximately 80 percent (e.g., no more than approximately 70 percent, no more than approximately 60 percent, no more than approximately 50 percent, no more than approximately 40 percent, and no more than approximately 30 percent) of light in the visible wavelength range.

Various appropriate conductive materials may be used for making the first electrode 10. Examples of appropriate conductive materials include substantially transparent conductive materials such as a metal oxide material. Optionally, the first electrode 10 is made of indium tin oxide. By having the first electrode 10 made of a substantially transparent conductive material, the reflectivity of the first electrode 10 is much reduced, further reducing microcavity effects in the top-emission type organic light emitting diode display substrate.

Various appropriate insulating materials may be used for making the planarization layer 8. Examples of appropriate insulating materials include insulating materials having a relatively low refractive index, e.g., insulating polymer materials having a relatively low refractive index. Optionally, the planarization layer 8 is made of polydimethylsiloxane (PDMS). By having the planarization layer 8 made of an insulating material having a relatively low refractive index, light reflection by the drain electrode 7 can be further reduced, minimizing microcavity effects in the top-emission type organic light emitting diode display substrate.

Various appropriate insulating materials may be used for making the passivation layer 9. Examples of appropriate insulating materials include silicon nitride ($SiN_x$).

Various appropriate conductive materials may be used for making the second electrode 12. Examples of appropriate conductive materials include substantially transparent metal materials. Optionally, the second electrode 12 is made of magnesium:silver alloy (Mg:Ag). Optionally, the second electrode 12 is made of nano-silver. By having a substantially transparent metallic second electrode 12, the fabrication process of the display substrate obviates the need of sputtering a substantially transparent metal oxide material for making the second electrode 12. The potential damages to the organic layer caused by the sputtering process can be entirely avoided, thereby simplifying the fabrication process and enhancing the quality and life time of the product. Optionally, the second electrode 12 is formed by a vapor deposition process, e.g., a plasma-enhanced chemical vapor deposition process.

Optionally, the buffer layer 2 has a thickness in a range of approximately 2000 Å to approximately 5000 Å. Optionally, the buffer layer 2 has a thickness of approximately 4000 Å.

Optionally, the active layer 3 has a thickness in a range of approximately 300 Å to approximately 800 Å. Optionally, the active layer 3 has a thickness of approximately 450 Å.

Optionally, the gate insulating layer 4 has a thickness in a range of approximately 800 Å to approximately 1200 Å. Optionally, the gate insulating layer 4 has a thickness of approximately 1000 Å.

Optionally, the gate electrode 5 has a thickness in a range of approximately 2000 Å to approximately 3000 Å. Optionally, the gate electrode 5 has a thickness of approximately 2500 Å.

Optionally, the inter-layer dielectric layer 6 has a thickness in a range of approximately 3000 Å to approximately 6000 Å. Optionally, the inter-layer dielectric layer 6 has a thickness of approximately 5000 Å.

Optionally, the drain electrode 7 has a thickness in a range of approximately 1500 Å to approximately 3000 Å. Optionally, the drain electrode 7 has a thickness of approximately 2000 Å.

Optionally, the planarization layer 8 has a thickness in a range of approximately 15000 Å to approximately 25000 Å. Optionally, the planarization layer 8 has a thickness of approximately 20000 Å.

Optionally, the passivation layer 9 has a thickness in a range of approximately 500 Å to approximately 1500 Å. Optionally, the passivation layer 9 has a thickness of approximately 1000 Å.

Optionally, the first electrode 10 has a thickness in a range of approximately 1000 Å to approximately 2000 Å. Optionally, the first electrode 10 has a thickness of approximately 1500 Å.

Optionally, the first hole injection layer 111 has a thickness of approximately 50 Å, the second hole injection layer 112 has a thickness of approximately 330 Å, the red light emitting layer 113 has a thickness of approximately 100 Å, the green light emitting layer 114 has a thickness of approximately 300 Å, the first electron transport layer 115 has a thickness of approximately 100 Å, the first charge generating layer 116 has a thickness of approximately 200 Å, the third hole injection layer 117 has a thickness of approximately 1100 Å, the hole transport layer 118 has a thickness of approximately 100 Å, the blue light emitting layer 119 has a thickness of approximately 250 Å, the second electron transport layer 120 has a thickness of approximately 400 Å, and the second charge generating layer 121 has a thickness of approximately 1000 Å.

Optionally, the planarization layer 8 has a refractive index of approximately 1.5. Optionally, the passivation layer 9 has a refractive index of approximately 2.0. Optionally, the first electrode 10 has a refractive index of approximately 1.8. Optionally, each of the sub-layers in the organic layer 11 (e.g., the organic light emitting layer 11a, the first hole injection layer 111, the green light emitting layer 114, etc.) has a refractive index of approximately 1.8.

Optionally, the planarization layer 8 includes a plurality of sub-layers. Optionally, each of the plurality of sub-layers of the planarization layer 8 has a different refractive index. Optionally, the refractive indexes of the plurality of sub-layers of the planarization layer 8 change in a step-wise fashion or in a linear fashion along the depth of the planarization layer 8. Optionally, the refractive indexes of the plurality of sub-layers of the planarization layer 8 decrease (e.g., in a step-wise fashion or in a linear fashion) along a thickness direction away from the base substrate 1. Similarly, in some embodiments, any of the other layers in the present display substrate may include a plurality of sub-layers, and the refractive indexes of the plurality of sub-layers may change in a step-wise fashion or in a linear fashion along the depth of the particular layer. Optionally, the refractive indexes of the plurality of sub-layers decrease (e.g., in a step-wise fashion or in a linear fashion) along a thickness direction away from the base substrate 1.

Referring to FIG. 1, the drain electrode 7 and the second electrode 12 in some embodiments form a microcavity structure M. As used herein, the term "microcavity" refers to a resonant optical cavity in a solid-state light emitting device. For example, in the context of the present disclosure, the drain electrode 7 and the second electrode 12 constitute two reflective mirrors in the microcavity structure M. Optionally, the microcavity structure M has an optical distance substantially equal to a sum of optical path lengths of layers between the drain electrode 7 and the second electrode 12. As used herein, the term "optical path length" refers to a value obtained by multiplying a refractive index n of a medium through which the measurement light travels by a distance the measurement light travels through the medium having the refractive index n. i.e., the optical path length is equal to a distance the measurement light would travel through a vacuum during the time it takes for the measurement light to travel through the medium having the refractive index n.

In some embodiments, the optical distance of the microcavity structure M is a non-integer multiple of $2\pi\lambda$, $\lambda$ is a wavelength of light emitted from the organic light emitting layer. By having the optical distance of the microcavity structure M to be a non-integer multiple of $2\pi\lambda$, the microcavity effects of the microcavity structure M can be effectively reduced.

In some embodiments, the optical distance of the microcavity structure M is substantially equal to a sum of optical path lengths of the passivation layer 9, the planarization layer 8, the organic layer 11, and the first electrode 10. Optionally, the optical distance of the microcavity structure M is substantially equal to $D_{PLN8}*N_{PLN8} + D_{PVX9}*N_{PVX9} + D_{ITO10}*N_{ITO10} + D_{HIL111}*N_{HIL111} + D_{HIL112}*N_{HIL112} + D_{REML113}*N_{REML113} + D_{GEML114}*N_{GEML114} + D_{ETL115}*N_{ETL115} + D_{CGL116}*N_{CGL116} + D_{HIL117}*N_{HIL117} + D_{HTL118}*N_{HTL118} + D_{BEML119}*N_{BEML119} + D_{ETL120}*N_{ETL120} + D_{CGL121}*N_{CGL121}$. Optionally, the optical distance of the microcavity structure M is substantially equal to 20000 Å*1.5+1000 Å*2.0+1500 Å*1.8+50 Å*1.8+330 Å*1.8+100 Å*1.8+300 Å*1.8+100 Å*1.8+200 Å*1.8+1100 Å*1.8+100 Å*1.8+250 Å*1.8+400 Å*1.8+100 Å*1.8=41774 Å, and substantially not equal to $k*2\pi\lambda$, wherein $D_{PLN8}$ is the thickness of the planarization layer 8; $N_{PLN8}$ is the refractive index of the planarization layer 8; $D_{PVX9}$ is the thickness of the passivation layer 9; $N_{PVX9}$ is the refractive index of the passivation layer 9; $D_{ITO10}$ is the thickness of the first electrode 10; $N_{ITO10}$ is the refractive index of the first electrode 10; $D_{HIL111}$ is the thickness of the first hole injection layer 111; $N_{HIL111}$ is the refractive index of the first hole injection layer 111; $D_{HIL112}$ is the thickness of the second hole injection layer 112; $N_{HIL112}$ is the refractive index of the second hole injection layer 112; $D_{REML113}$ is the thickness of the red light emitting layer 113; $N_{REML113}$ is the refractive index of the red light emitting layer 113; $D_{GEML114}$ is the thickness of the green light emitting layer 114; $N_{GEML114}$ is the refractive index of the green light emitting layer 114; $D_{ETL115}$ is the thickness of the first electron transport layer 115; $N_{ETL115}$ is the refractive index of the first electron transport layer 115; $D_{CGL116}$ is the thickness of the first charge generating layer 116; $N_{CGL116}$ is the refractive index of the first charge generating layer 116; $D_{HIL117}$ is the thickness of the third hole injection layer 117;

$N_{HIL117}$ is the refractive index of the third hole injection layer 117; $D_{HTL118}$ is the thickness of the hole transport layer 118; $N_{HTL118}$ is the refractive index of the hole transport layer 118; $D_{BEML119}$ is the thickness of the blue light emitting layer 119; $N_{BEML119}$ is the refractive index of the blue light emitting layer 119; $D_{ETL120}$ is the thickness of the second electrode transport layer 120; $N_{ETL120}$ is the refractive index of the second electrode transport layer 120; $D_{CGL121}$ is the thickness of the second charge generating layer 121; $N_{CGL121}$ is the refractive index of the second charge generating layer 121; k is a positive integer, and λ is a wavelength of light emitted from the organic light emitting layer.

Optionally, the planarization layer 8 includes a plurality of sub-layers. The optical path length of the planarization layer 8 is substantially equal to the sum of optical path lengths of the plurality of sub-layers of the planarization layer 8. Similarly, in some embodiments, any of the other layers in the present display substrate may include a plurality of sub-layers, and the optical path length of a particular layer is substantially equal to the sum of optical path lengths of the plurality of sub-layers of that particular layer.

In the present display substrate, the optical distance of the microcavity structure M is designed to be a non-integer multiple of 2πλ, λ is a wavelength of light emitted from the organic light emitting layer. For example, the optical distance of the microcavity structure M may be set by choosing a thickness and a refractive index for each layer between the drain electrode 7 and the second electrode 12. By having this design, the microcavity effects of the microcavity structure M can be effectively reduced.

Figure 3:
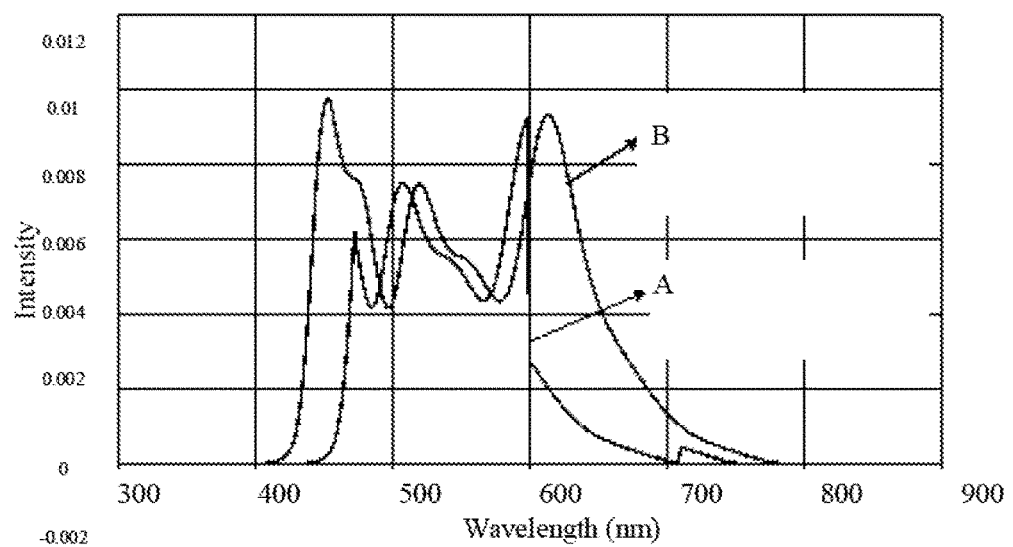
FIG. 3 is a comparison between emission spectra of a conventional organic light emitting diode display substrate and a top-emission type organic light emitting diode display substrate in some embodiments according to the present disclosure.

FIG. 3 is a comparison between emission spectra of a conventional organic light emitting diode display substrate and a top-emission type organic light emitting diode display substrate in some embodiments according to the present disclosure. Referring to FIG. 3, the emission spectrum of the conventional organic light emitting diode display substrate is denoted as "A", and the emission spectrum of the present top-emission type organic light emitting diode display substrate is denoted as "B". The present top-emission type organic light emitting diode display substrate has reduced microcavity effects as compared to the conventional organic light emitting diode display substrate. As shown in FIG. 3, the present top-emission type organic light emitting diode display substrate has a broader emission spectrum as compared to that of the conventional organic light emitting diode display substrate. Thus, the present top-emission type organic light emitting diode display substrate achieves a full spectrum emission of light.

Figure 4:
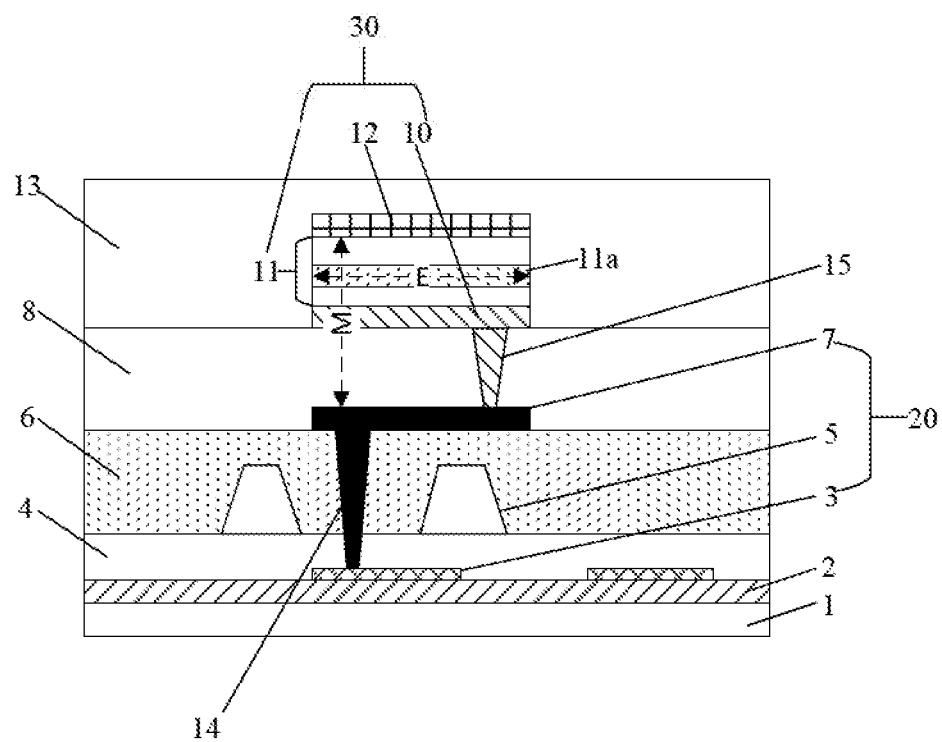
FIG. 4 is a schematic diagram illustrating the structure of a top-emission type organic light emitting diode display substrate in some embodiments according to the present disclosure.

FIG. 4 is a schematic diagram illustrating the structure of a top-emission type organic light emitting diode display substrate in some embodiments according to the present disclosure. Referring to FIG. 4, the top-emission type organic light emitting diode display substrate in some embodiments does not include a passivation layer (as compared to that in FIG. 1). The planarization layer 8 is between the first electrode 10 and the drain electrode 7. Specifically, the planarization layer 8 is on a side of the drain electrode 7 distal to the base substrate 1, and the first electrode 10 is on a side of the planarization layer 8 distal to the drain electrode 7. The second via 15 extends through the planarization layer 8, and the first electrode 10 is electrically connected to the drain electrode 7 through the second via 15.

Optionally, the optical distance of the microcavity structure M is substantially equal to a sum of optical path lengths of the planarization layer 8, the organic layer 11, and the first electrode 10.

In some embodiments of the present display substrate, a microcavity is not formed between the first electrode 10 and the second electrode 12, but between the drain electrode 7 and the second electrode 10. The first electrode 10 is disposed at a position corresponding to the drain electrode 7. The width of the drain electrode 7 is equal to or greater than that of the first electrode 10. The microcavity structure in the present display substrate has a much greater optical distance as compared to that in the conventional display substrate, resulting in much reduced microcavity effects. The present display substrate achieves a full spectrum emission of light and enhanced light emission properties. The first electrode 10 is made of a substantially transparent conductive material such as a substantially transparent metal oxide, reducing reflectivity of the first electrode 10 and microcavity effects. The second electrode 12 is made of a metal material, obviating a sputtering process for depositing electrode material for forming the second electrode 12, thus avoiding any damages to the organic layer 11 accompanied by the sputtering process. A simplified fabricating process and enhanced product quality and life time can be achieved. By choosing the thicknesses and refractive indexes for each of the layers between the drain electrode 7 and the second electrode 12, the optical distance can be set to be a non-integer multiple of 2πλ, further reducing microcavity effects in the present display substrate.

In another aspect, the present disclosure provides a top-emission type organic light emitting diode display apparatus having a top-emission type organic light emitting diode display substrate described herein. Optionally, the top-emission type organic light emitting diode display substrate is a white light emitting display substrate. Optionally, the top-emission type organic light emitting diode display apparatus further includes a color filter substrate facing the light emitting side of the top emission type organic light emitting diode display apparatus. Optionally, the top-emission type organic light emitting diode display apparatus includes an encapsulating layer on the light emitting side of the top-emission type organic light emitting diode display substrate, and the color filter substrate is on a side of the encapsulating layer distal to the top-emission type organic light emitting diode display substrate.

In another aspect, the present disclosure provides a method of forming a top-emission type organic light emitting diode display substrate having a plurality of subpixel areas. In some embodiments, the method includes, in each of the plurality of subpixel areas, forming a thin film transistor including a drain electrode on the base substrate, the drain electrode is formed using a reflective conductive material; and forming an organic light emitting diode on a side of the drain electrode distal to the base substrate. Optionally, the step of forming the organic light emitting diode includes forming a first electrode on a side of the drain electrode distal to the base substrate, the first electrode is formed using a substantially transparent conductive material and formed to be electrically connected to the drain electrode; forming an organic layer on a side of the first electrode distal to the drain electrode, the organic layer including an organic light emitting layer; and forming a second electrode on a side of the organic layer distal to the first electrode. Optionally, the top-emission type organic light emitting diode display substrate is formed to emit light substantially along a direction from the first electrode to the second electrode.

Optionally, the drain electrode and the organic light emitting layer are formed so that an orthographic projection of the drain electrode on the base substrate substantially covers that of a light emitting region of the organic light emitting layer. Optionally, the drain electrode and the organic light emitting layer are formed so that the orthographic projection of the drain electrode on the base substrate substantially overlaps with that of the light emitting region of the organic light emitting layer. Optionally, the drain electrode and the first electrode layer are formed so that the orthographic projection of the drain electrode on the base substrate substantially covers that of the first electrode layer. Optionally, the drain electrode and the first electrode layer are formed so that the orthographic projection of the drain electrode on the base substrate substantially overlaps with that of the first electrode layer.

Optionally, the method further includes forming a planarization layer on a side of the drain electrode distal to the base substrate. Optionally, the method further includes forming a passivation layer on a side of the planarization layer distal to the drain electrode.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A top-emission type organic light emitting diode display substrate having a plurality of subpixel areas, in each of which the top-emission type organic light emitting diode display substrate comprising:
    a base substrate;
    a thin film transistor on the base substrate and comprising a drain electrode, the drain electrode is a reflective electrode; and
    an organic light emitting diode on a side of the drain electrode distal to the base substrate;
    wherein the organic light emitting diode comprises:
    a first electrode on a side of the drain electrode distal to the base substrate, the first electrode is a substantially transparent electrode and electrically connected to the drain electrode;
    an organic layer on a side of the first electrode distal to the drain electrode, the organic layer comprises an organic light emitting layer; and
    a second electrode on a side of the organic layer distal to the first electrode, the second electrode is a substantially transparent electrode;
    wherein the top-emission type organic light emitting diode display substrate further comprises:
    a planarization layer on a side of the drain electrode distal to the base substrate; and
    a passivation layer on a side of the planarization layer distal to the drain electrode;
    wherein the drain electrode and the second electrode form a microcavity structure; and
    an optical distance of the microcavity structure is substantially equal to a sum of optical path lengths of the passivation layer, the planarization layer, the organic layer, and the first electrode.

2. The top-emission type organic light emitting diode display substrate of claim 1, wherein an orthographic projection of the drain electrode on the base substrate substantially covers that of a light emitting region of the organic light emitting layer.

3. The top-emission type organic light emitting diode display substrate of claim 2, wherein the orthographic projection of the drain electrode on the base substrate substantially overlaps with that of the light emitting region of the organic light emitting layer.

4. The top-emission type organic light emitting diode display substrate of claim 1, wherein the orthographic projection of the drain electrode on the base substrate substantially covers that of the first electrode layer.

5. The top-emission type organic light emitting diode display substrate of claim 4, wherein the orthographic projection of the drain electrode on the base substrate substantially overlaps with that of the first electrode layer.

6. The top-emission type organic light emitting diode display substrate of claim 1, wherein the microcavity structure has an optical distance substantially equal to a sum of optical path lengths of the passivation layer, the planarization layer, the organic layer, and the first electrode.

7. The top-emission type organic light emitting diode display substrate of claim 6, wherein the optical distance is a non-integer multiple of $2\pi\lambda$, $\lambda$ is a wavelength of light emitted from the organic light emitting layer of the organic layer.

8. The top-emission type organic light emitting diode display substrate of claim 1, wherein the drain electrode is made of a low-reflectivity metal material.

9. The top-emission type organic light emitting diode display substrate of claim 8, wherein the drain electrode is made of molybdenum or nickel.

10. The top-emission type organic light emitting diode display substrate of claim 1, wherein the second electrode is made of a metallic material.

11. The top-emission type organic light emitting diode display substrate of claim 10, wherein the second electrode is made of magnesium:silver alloy.

12. The top-emission type organic light emitting diode display substrate of claim 1, wherein the first electrode has a thickness in a range of approximately 800 Å to approximately 2000 Å.

13. The top-emission type organic light emitting diode display substrate of claim 1, wherein the planarization layer has a thickness in a range of approximately 10000 Å to approximately 30000 Å.

14. A top-emission type organic light emitting diode display apparatus, comprising a top-emission type organic light emitting diode display substrate of claim 1.

15. A top-emission type organic light emitting diode display substrate having a plurality of subpixel areas, in each of which the top-emission type organic light emitting diode display substrate comprising:
a base substrate;
a thin film transistor on the base substrate and comprising a drain electrode, the drain electrode is a reflective electrode; and
an organic light emitting diode on a side of the drain electrode distal to the base substrate;
wherein the organic light emitting diode comprises:
a first electrode on a side of the drain electrode distal to the base substrate, the first electrode is a substantially transparent electrode and electrically connected to the drain electrode;
an organic layer on a side of the first electrode distal to the drain electrode, the organic layer comprises an organic light emitting layer; and
a second electrode on a side of the organic layer distal to the first electrode, the second electrode is a substantially transparent electrode;
wherein the top-emission type organic light emitting diode display substrate further comprises:
a planarization layer on a side of the drain electrode distal to the base substrate; and
a passivation layer on a side of the planarization layer distal to the drain electrode;
wherein the drain electrode and the second electrode form a microcavity structure;
the planarization layer comprises a plurality of sub-layers; and
refractive indexes of the plurality of sub-layers of the planarization layer decrease along a thickness direction away from the base substrate.

16. The top-emission type organic light emitting diode display substrate of claim 15, wherein the microcavity structure has an optical distance substantially equal to a sum of optical path lengths of the passivation layer, the planarization layer, the organic layer, and the first electrode.

17. The top-emission type organic light emitting diode display substrate of claim 16, wherein the optical distance is a non-integer multiple of $2\pi\lambda$, $\lambda$ is a wavelength of light emitted from the organic light emitting layer of the organic layer.

18. A top-emission type organic light emitting diode display apparatus, comprising a top-emission type organic light emitting diode display substrate of claim 15.

19. A method of forming a top-emission type organic light emitting diode display substrate having a plurality of subpixel areas, the method comprising, in each of the plurality of subpixel areas:
forming a thin film transistor comprising a drain electrode on the base substrate, the drain electrode is formed using a reflective conductive material; and
forming an organic light emitting diode on a side of the drain electrode distal to the base substrate;
wherein forming the organic light emitting diode comprises:
forming a first electrode on a side of the drain electrode distal to the base substrate, the first electrode is formed using a substantially transparent conductive material and formed to be electrically connected to the drain electrode;
forming an organic layer on a side of the first electrode distal to the drain electrode, the organic layer comprises an organic light emitting layer; and
forming a second electrode on a side of the organic layer distal to the first electrode, the second electrode is formed using a substantially transparent conductive material;
wherein the method further comprises:
forming a planarization layer on a side of the drain electrode distal to the base substrate; and
forming a passivation layer on a side of the planarization layer distal to the drain electrode;
wherein the drain electrode and the second electrode form a microcavity structure; and
an optical distance of the microcavity structure is substantially equal to a sum of optical path lengths of the passivation layer, the planarization layer, the organic layer, and the first electrode.

20. The method of claim 19, wherein forming the second electrode is performed by a vapor deposition process.

* * * * *